United States Patent
Wang et al.

(10) Patent No.: US 12,514,045 B2
(45) Date of Patent: Dec. 30, 2025

(54) MICRO LIGHT-EMITTING DEVICE, METHOD FOR MAKING THE SAME, AND LIGHT-EMITTING APPARATUS

(71) Applicant: Xiamen Sanan Optoelectronics Technology Co., Ltd., Fujian (CN)

(72) Inventors: Yenchin Wang, Xiamen (CN); Song Yang, Fujian (CN); Xiaolong Wei, Fujian (CN); Huanshao Kuo, Tianjin (CN); Yu-Ren Peng, Tianjin (CN)

(73) Assignee: QUANZHOU SAN'AN SEMICONDUCTOR TECHNOLOGY CO., LTD., Nanan (CN)

( * ) Notice: Subject to any disclaimer, the term of this patent is extended or adjusted under 35 U.S.C. 154(b) by 510 days.

(21) Appl. No.: 17/987,380

(22) Filed: Nov. 15, 2022

(65) Prior Publication Data
US 2023/0216007 A1    Jul. 6, 2023

(30) Foreign Application Priority Data
Dec. 31, 2021    (CN) .......................... 202111673206.7

(51) Int. Cl.
*H10H 20/00*      (2025.01)
*H10H 20/01*      (2025.01)
(Continued)

(52) U.S. Cl.
CPC .......... *H10H 20/857* (2025.01); *H10H 20/01* (2025.01); *H10H 20/8312* (2025.01); *H10H 20/0364* (2025.01)

(58) Field of Classification Search
CPC .. H10H 20/857; H10H 20/01; H10H 20/8312; H10H 20/0364; H10H 20/03; H10H 20/819; H10H 20/013; H10H 20/81; H10H 20/812; H10H 20/814; H10H 20/821
(Continued)

(56) References Cited

U.S. PATENT DOCUMENTS

| | | | |
|---|---|---|---|
| 8,895,337 B1 * | 11/2014 | Wang ................... | H10H 20/811 438/22 |
| 2011/0204395 A1 * | 8/2011 | Hong ................. | H10H 20/8312 257/E33.048 |

(Continued)

*Primary Examiner* — Sheikh Maruf
(74) *Attorney, Agent, or Firm* — MUNCY, GEISSLER, OLDS & LOWE, P.C.

(57) ABSTRACT

A micro light-emitting device includes an epitaxial structure and a bridge connection structure. The epitaxial structure includes a first mesa surface and a second mesa surface which are located on the same side of the epitaxial structure with a height difference therebetween, which have the same widths in a first direction, and which respectively have center points in the first direction that are aligned in a second direction perpendicular to the first direction. The bridge connection structure includes a first bridge connection layer that is formed on the first and second mesa surfaces so as to be symmetrically disposed on at least one of the first and second mesa surfaces with a line of symmetry thereof being in the second direction and passing through the center points of the first and second mesa surfaces. A method for making the same, and a light-emitting apparatus including the same are also disclosed.

15 Claims, 12 Drawing Sheets

(51) Int. Cl.
*H10H 20/831* (2025.01)
*H10H 20/857* (2025.01)

(58) Field of Classification Search
USPC .......................................................... 257/79
See application file for complete search history.

(56) References Cited

U.S. PATENT DOCUMENTS

| | | | |
|---|---|---|---|
| 2012/0040483 A1* | 2/2012 | Ahn | H10H 20/01 |
| | | | 438/46 |
| 2012/0187430 A1* | 7/2012 | West | H10H 20/8582 |
| | | | 257/E33.056 |
| 2012/0223289 A1* | 9/2012 | Gwo | H10H 29/142 |
| | | | 438/35 |
| 2013/0011953 A1* | 1/2013 | Nakajo | H10H 20/833 |
| | | | 438/46 |
| 2013/0026447 A1* | 1/2013 | Kloth | H10H 20/816 |
| | | | 257/E33.069 |
| 2013/0126891 A1* | 5/2013 | Bibl | H10H 20/812 |
| | | | 257/E33.025 |
| 2015/0115290 A1* | 4/2015 | Guenard | H10H 20/857 |
| | | | 257/431 |
| 2016/0104818 A1* | 4/2016 | Chang | H05B 45/10 |
| | | | 438/22 |

* cited by examiner

MICRO LIGHT-EMITTING DEVICE, METHOD FOR MAKING THE SAME, AND LIGHT-EMITTING APPARATUS

CROSS-REFERENCE TO RELATED APPLICATION

This application claims priority to Chinese Invention Patent Application No. 202111673206.7, filed on Dec. 31, 2021, which is hereby incorporated herein by reference in its entirety.

FIELD

The disclosure relates to a micro light-emitting device, a method for making the same, and a light-emitting apparatus.

BACKGROUND

Micro light-emitting diodes (micro LEDs) have advantages such as low power consumption, ultra-high resolution, high color saturation, fast response time, and long service life, and are considered a promising display technology.

A conventional method for making micro LEDs includes a step of forming, on an epitaxial structure, a first mesa surface and a second mesa surface simultaneously, and a step of forming a bridge connection structure on the first and second mesa surfaces of the epitaxial structure. In the conventional method, the second mesa surface is formed so that the second mesa surface surrounds the first mesa surface and has a height lower than that of the first mesa surface. Under the current trend of micro LED miniaturization, exposure machines used in the microfabrication process of the micro LEDs have an accuracy limitation that may cause misalignment of the first and second mesa surfaces during their formation. In such cases, the second mesa surface may be formed asymmetrically relative to the first mesa surface, and such asymmetry may cause the bridge connection structure to be formed asymmetrically.

If the bridge connection is formed asymmetrically, the stress distribution in the micro LED may become uneven, which may result in the bridge connection structure breaking, and which may further result in the epitaxial structure separating from the bridge connection structure.

SUMMARY

Therefore, an object of the disclosure is to provide a micro light-emitting device, a method for making the same, and a light-emitting apparatus each of which can alleviate at least one of the drawbacks of the prior art.

According to a first aspect of the disclosure, the micro light-emitting device includes an epitaxial structure and a bridge connection structure. The epitaxial structure includes a first mesa surface and a second mesa surface. The first and second mesa surfaces are located on the same side of the epitaxial structure with a height difference therebetween, have the same widths in a first direction, and have center points in the first direction that are aligned in a second direction perpendicular to the first direction. The bridge connection structure includes a first bridge connection layer that is formed on the first and second mesa surfaces so that the first bridge connection layer is symmetrically disposed on at least one of the first and second mesa surfaces with a line of symmetry thereof being in the second direction and passing through the center points of the first and second mesa surfaces.

According to a second aspect of the disclosure, the method for making a micro light-emitting device includes the steps of:
(a) forming an epitaxial structure;
(b) etching the epitaxial structure from a first side of the epitaxial structure to form a groove that recesses in a thickness direction into the epitaxial structure and that extends through the epitaxial structure in a first direction that is perpendicular to the thickness direction, such that the epitaxial structure has a first mesa surface that is a surface of the first side of the epitaxial structure and a second mesa surface that is a surface exposed from the groove, the groove having a width in the first direction that is the same as that of the epitaxial structure;
(c) forming a first bridge connection layer on the first and second mesa surfaces; and
(d) etching the epitaxial structure from a second side that is opposite to the first side of the epitaxial structure, such that the first and second mesa surfaces have the same widths in the first direction, and respectively have center points in the first direction that are aligned in a second direction perpendicular to both the first direction and the thickness direction, and such that the first bridge connection layer is symmetrically disposed on at least one of the first and second mesa surfaces with a line of symmetry thereof being in the second direction and passing through the center points of the first and second mesa surfaces.

According to a third aspect of the disclosure, the light-emitting apparatus includes the aforesaid micro light-emitting device.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
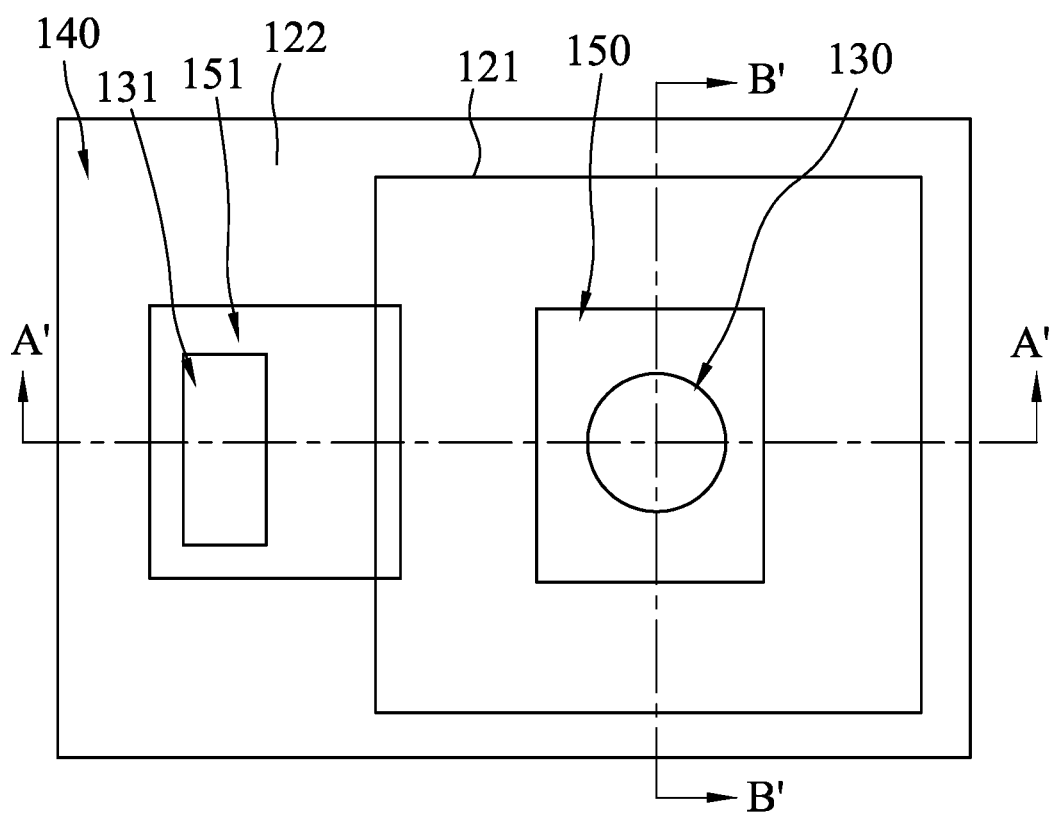
FIG. 1 is a schematic top view illustrating a conventional micro light-emitting device.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

FIG. 1 and FIGS. 2a to 2g show a conventional method for making a micro light-emitting device. The conventional method includes the following steps S1 to S7.

In step S1, a first mesa surface 121 and a second mesa surface 122 are formed on an epitaxial structure 120 simultaneously.

Figure 2A:
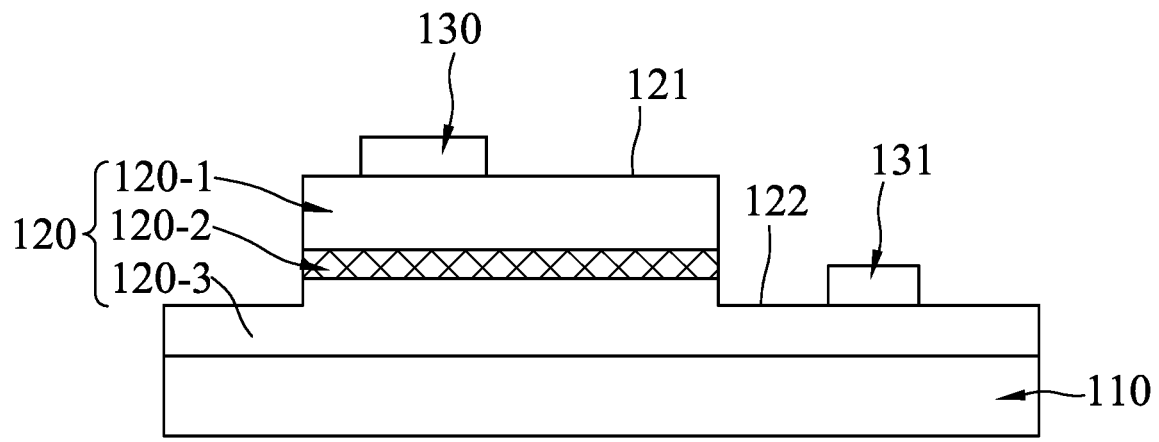
FIG. 2a is a schematic cross-sectional view illustrating an intermediate step in a making process of the conventional micro light-emitting device, and taken along a line similar to line A-A' of FIG. 1.
Figure 2B:
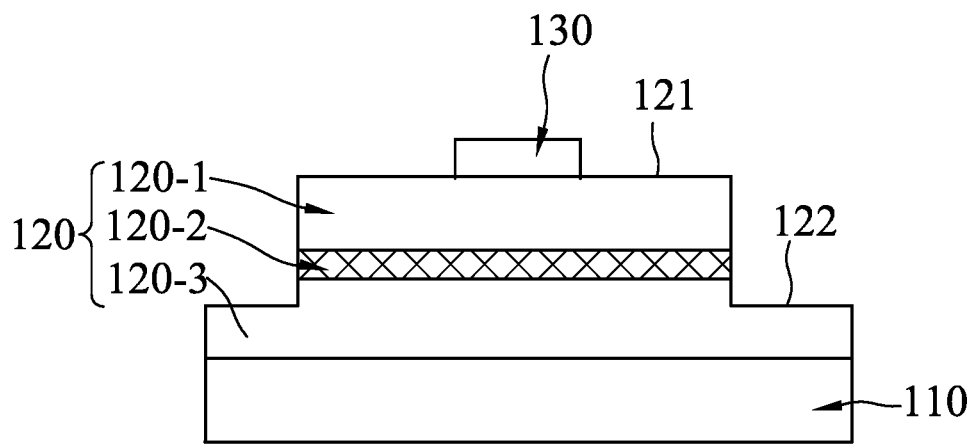
FIGS. 2b to 2g are schematic cross-sectional views illustrating intermediate steps in the making process of the conventional micro light-emitting device, and taken along line B'-B' of FIG. 1.

In particular, as shown in FIGS. 2a and 2b, firstly, the epitaxial structure 120 is formed on a growth substrate 110. The epitaxial structure 120 includes a first semiconductor layer 120-1, an active layer 120-2, and a second semiconductor layer 120-3 that are sequentially disposed on one another in such order from top to bottom. The epitaxial structure 120 is etched from a side opposite to the growth substrate 110 so that the first mesa surface 121 and the second mesa surface 122 are formed thereon simultaneously. The first mesa surface 121 is an upper surface of the first semiconductor layer 120-1, while the second mesa surface 122 is an exposed upper surface of the second semiconductor layer 120-3 and surrounds the first mesa surface 121.

In step S2, as shown in FIGS. 2a and 2b, a first electrode 130 is formed on the first mesa surface 121 to be electrically connected to the first semiconductor layer 120-1; and a second electrode 131 is formed on the second mesa surface 122 to be electrically connected to the second semiconductor layer 120-3.

Figure 2C:
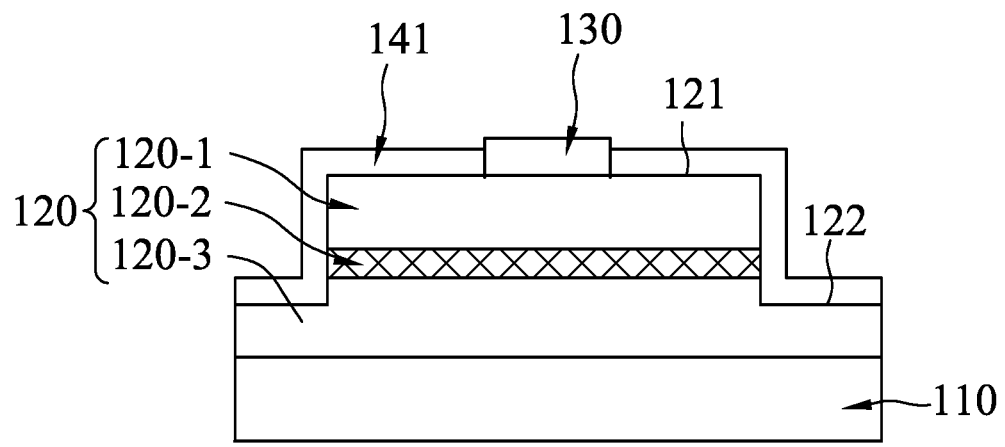

In step S3, as shown in FIG. 2c, a first bridge connection layer 141 is formed on the first and second mesa surface 121, 122. The first bridge connection layer 141 leaves the first and second electrodes 130, 131 exposed.

Figure 2D:
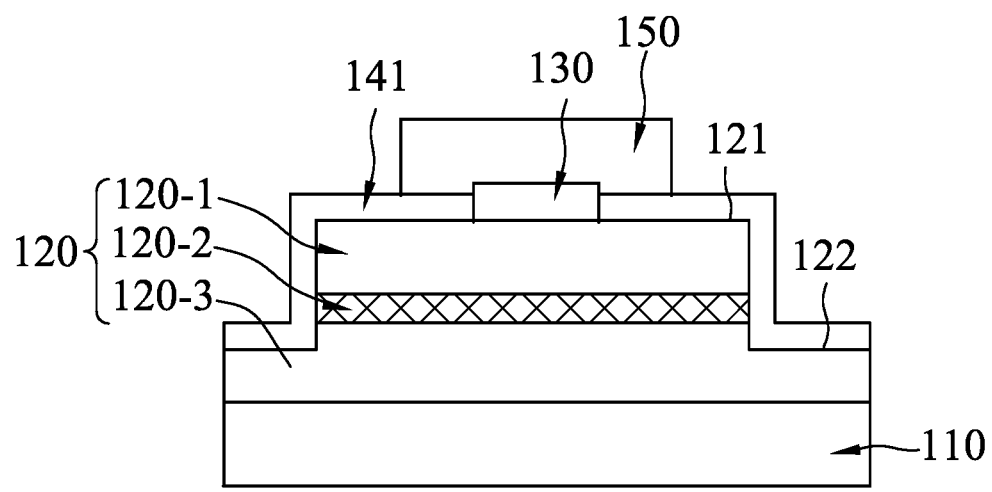

In step S4, as shown in FIG. 2d, a first pad 150 is formed on the first mesa surface 121 to be electrically connected to the first electrode 130; and a second pad 151 (see FIG. 1) is formed on the second mesa surface 122 to be electrically connected to the second electrode 131.

Figure 2E:
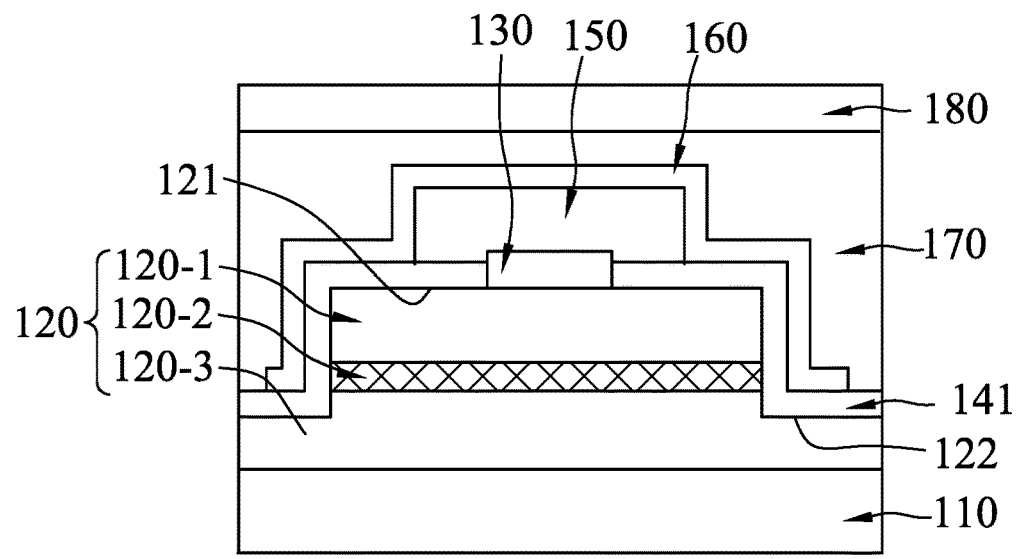

In step S5, as shown in FIG. 2e, the first and second pads 150, 151 are bonded to a substrate 180. In particular, a sacrificial layer 160 is formed on the first bridge connection layer 141, the first pad 150, and the second pad 151, and is bonded to the substrate 180 via a bonding layer 170. The sacrificial layer 160 may be a titanium-tungsten (TiW) film layer or other film layer that can be easily removed by wet etching techniques. The bonding layer 170 may be made of any bonding agent, and may be a benzocyclobutene layer.

Figure 2F:
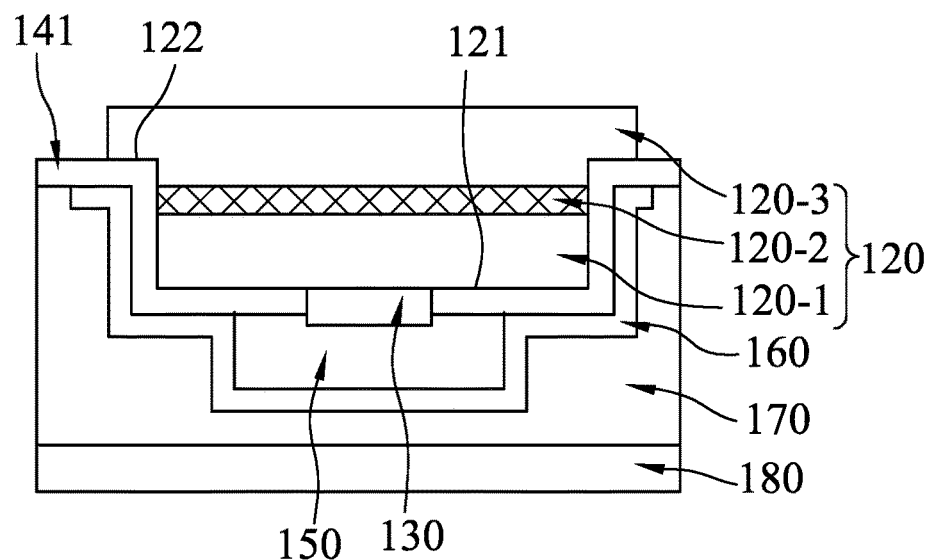

In step S6, as shown in FIG. 2f, the growth substrate 110 is removed, and the epitaxial layer 120 is etched.

Figure 2G:
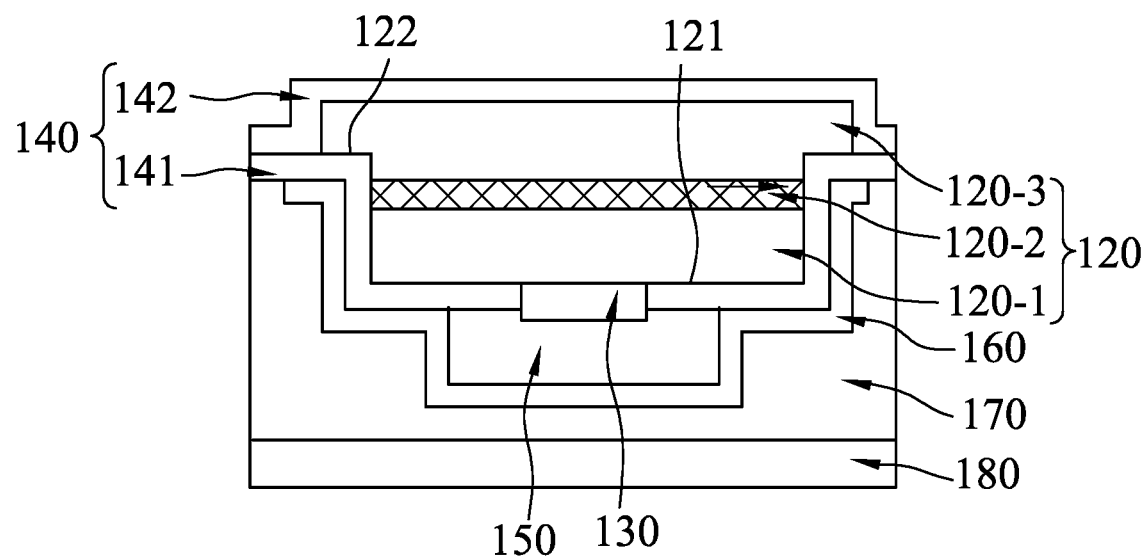

In step S7, as shown in FIG. 2g, a second bridge connection layer 142 is formed on a light exiting surface and a lateral surface of the epitaxial layer 120. The light exiting surface is opposite to the first mesa surface 121. The first and second bridge connection layers 141, 142 cooperatively form a bridge connection structure 140.

With the miniaturization of micro light-emitting devices, the accuracy limitations of the exposure machine have become a constraint in the manufacture of micro light-emitting devices. In the conventional method of making the micro light-emitting devices, the widths of parts of the second mesa surface 122 which are located on opposite sides of the first mesa surface 121 may be formed with a different length in a width direction of the micro light-emitting device (i.e., a direction along line B'-B' of FIG. 1) due to the accuracy limitations. This causes the first bridge connection layer 141 to be formed asymmetrically with respect to the first mesa surface 121, so that the stress distribution in the micro light-emitting device may become uneven, which may result in the first bridge connection layer 141 breaking, and which may further result in the epitaxial structure 120 separating from the first bridge connection layer 141, thus affecting the reliability of the micro light-emitting device. In addition, because the first mesa surface 121 is surrounded by the second mesa surface 122, an interface between the first bridge connection layer 141 and the sacrificial layer 160 includes a number of inflection points (corners). Thus, when the sacrificial layer 160 is to be removed through a wet etching process, the etching may proceed unequally so that the sacrificial layer 160 may partially remain unremoved.

In order to alleviate at least one of aforesaid problems of the conventional technique, the disclosure discloses a micro light-emitting device and a method for making the same. The micro light-emitting device has a configuration that may avoid an uneven stress distribution therein, thereby improving the stability thereof.

In certain embodiments, the micro light-emitting device may be a micro LED. The micro-LED may have a minimal width and a minimal length each ranging from 0.5 µm to 5 µm, from 5 µm to 10 µm, from 10 µm to 20 µm, from 20 µm to 50 µm, or from 50 µm to 100 µm.

Figure 3A:
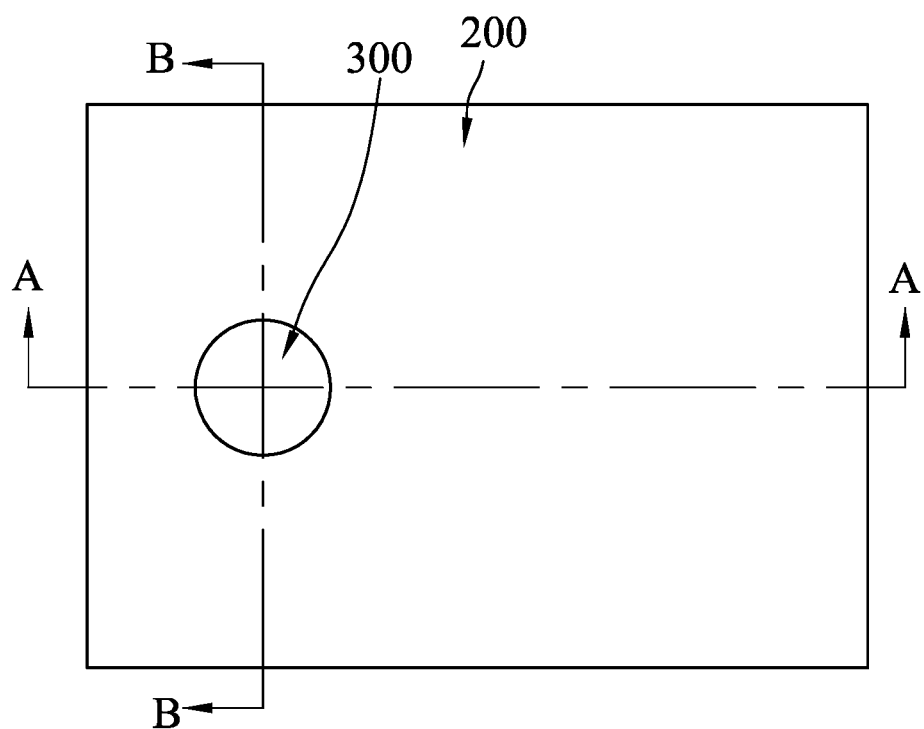
FIGS. 3a to 3d are schematic top views illustrating intermediate steps in a making process of an embodiment of a micro light-emitting device according to the disclosure.
Figure 3B:
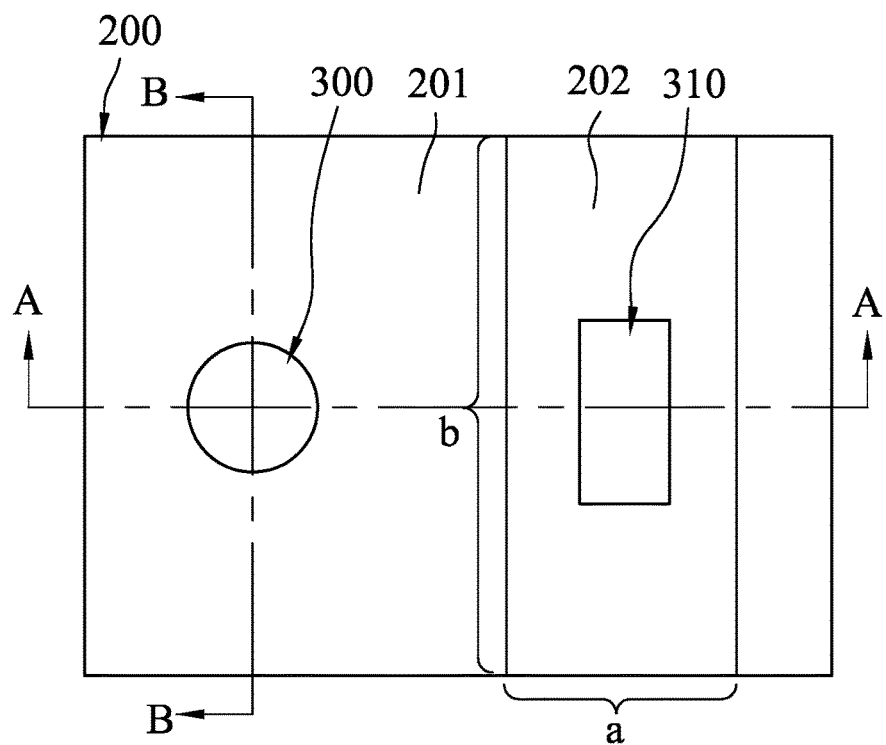
Figure 3C:
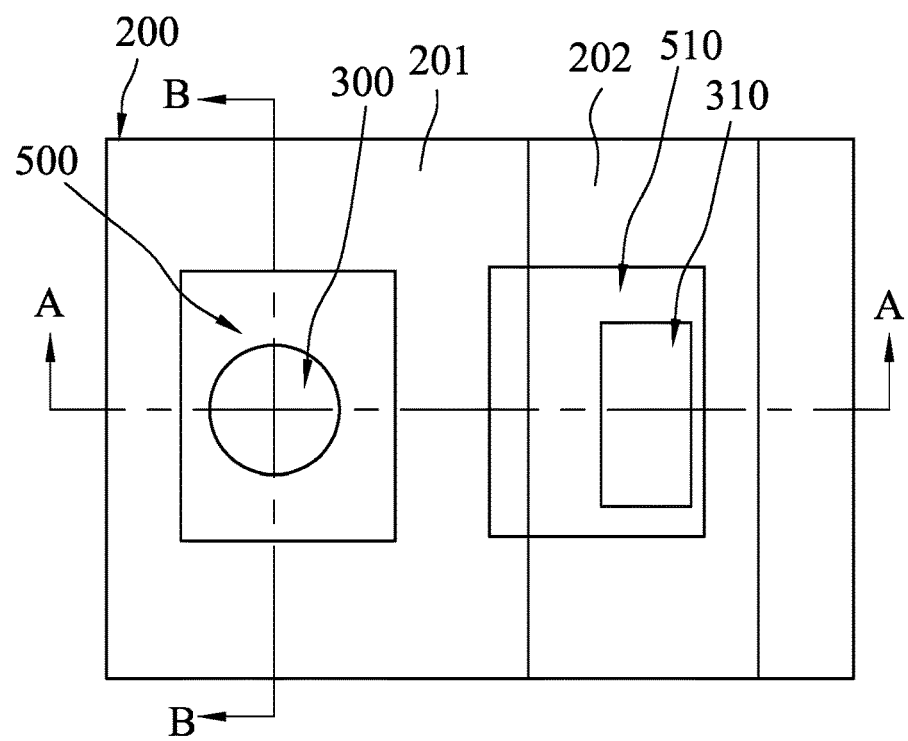
Figure 3D:
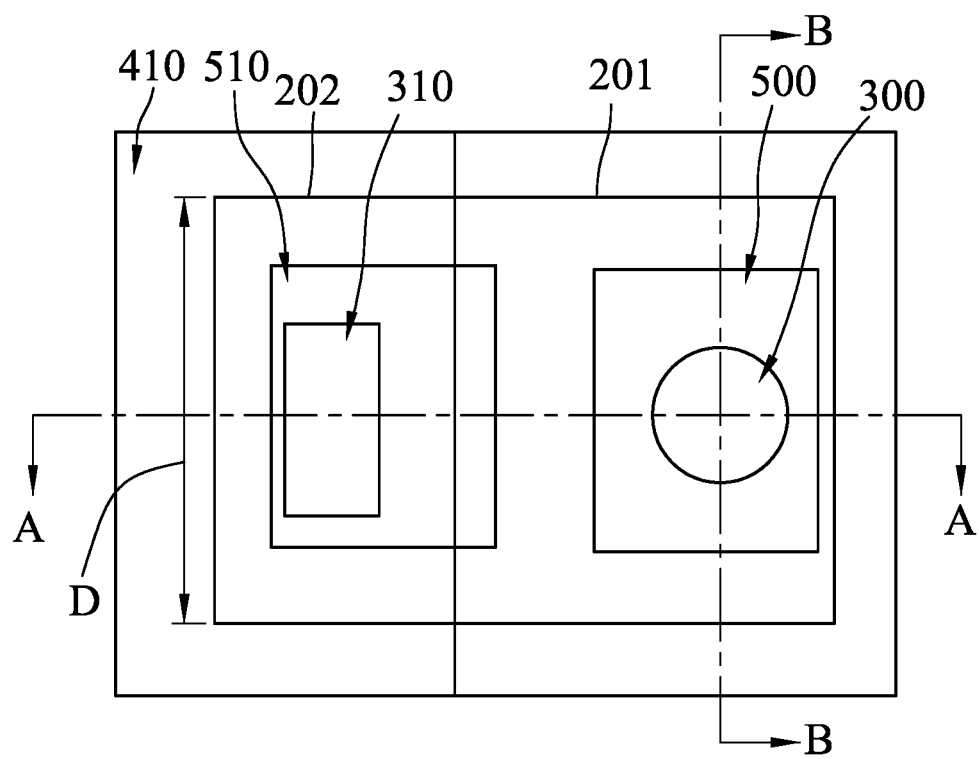
Figure 4A:
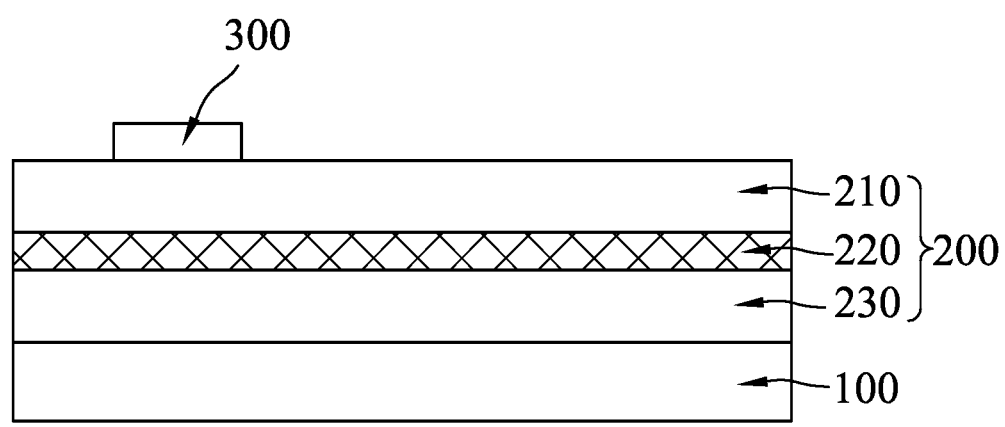
FIGS. 4a and 4b are schematic cross-sectional views taken along line A-A of FIGS. 3a and 3b, illustrating intermediate steps in the making process of the embodiment of the micro light-emitting device.
Figure 4B:
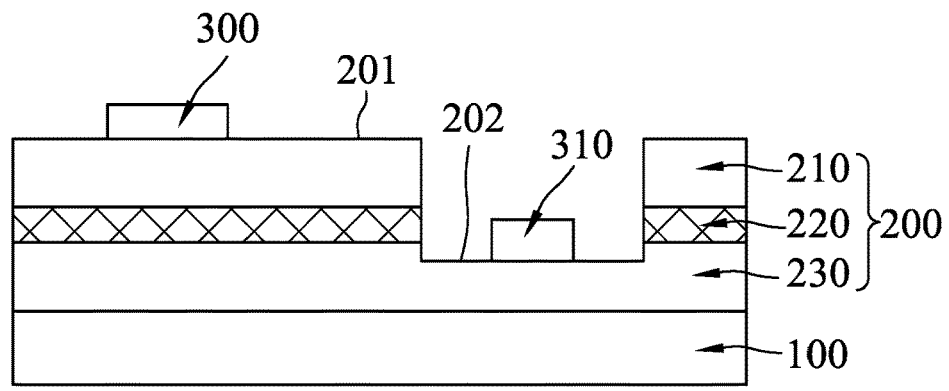
Figure 4C:
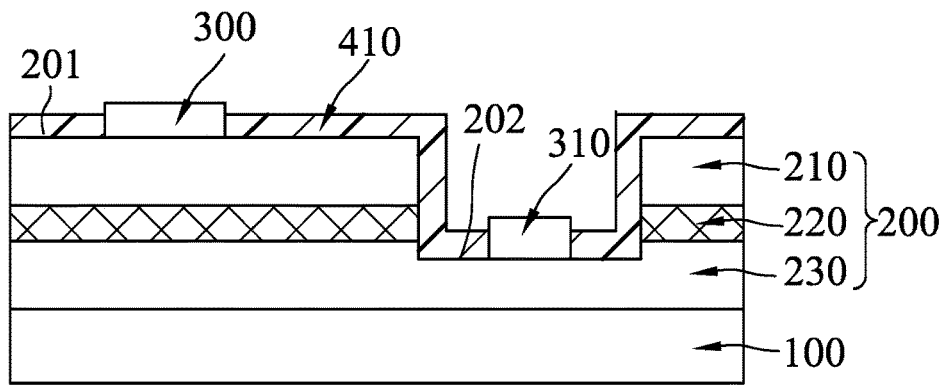
FIGS. 4c to 4g are schematic cross-sectional views illustrating intermediate steps subsequent to FIG. 4b in the making process of the embodiment of the micro light-emitting device.
Figure 4D:
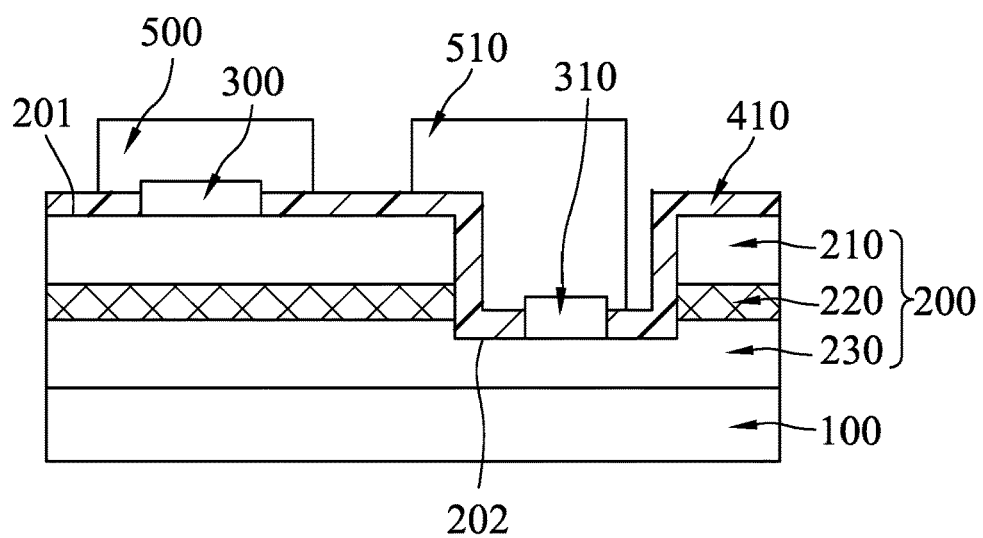
Figure 4E:
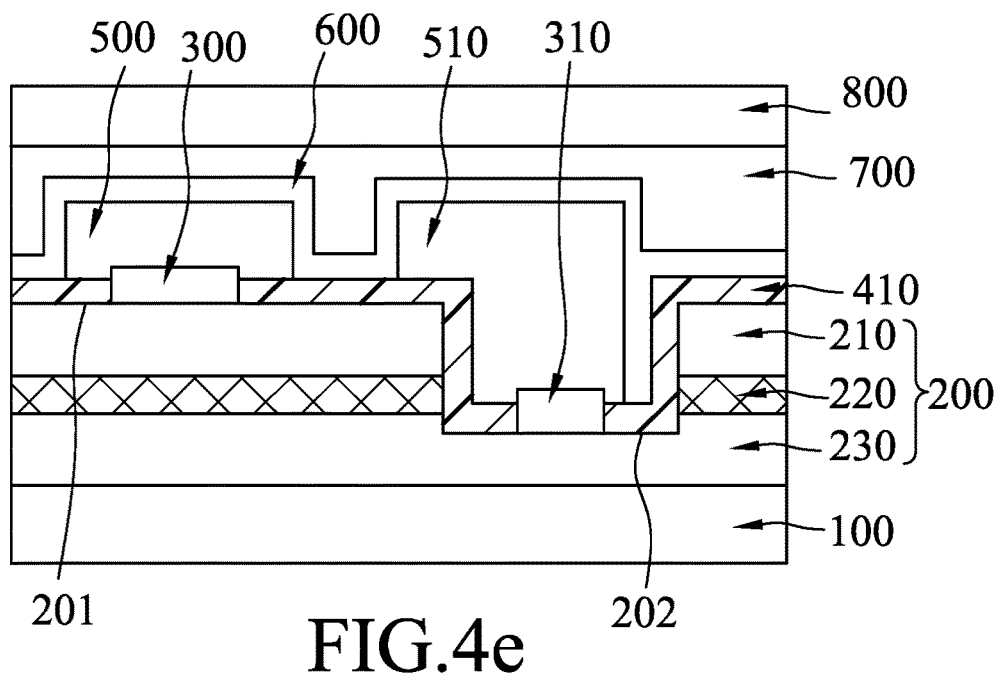
Figure 4F:
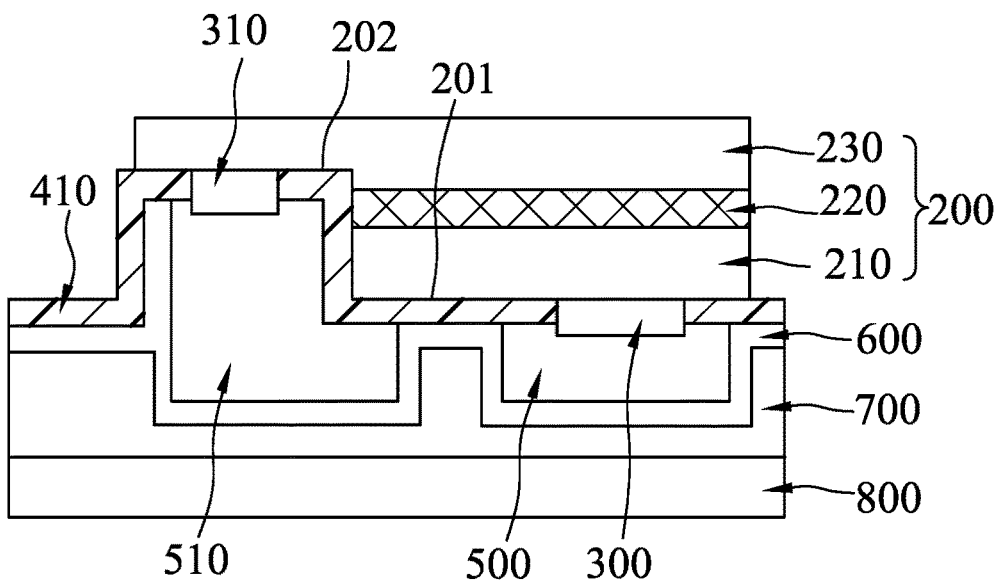
Figure 4G:
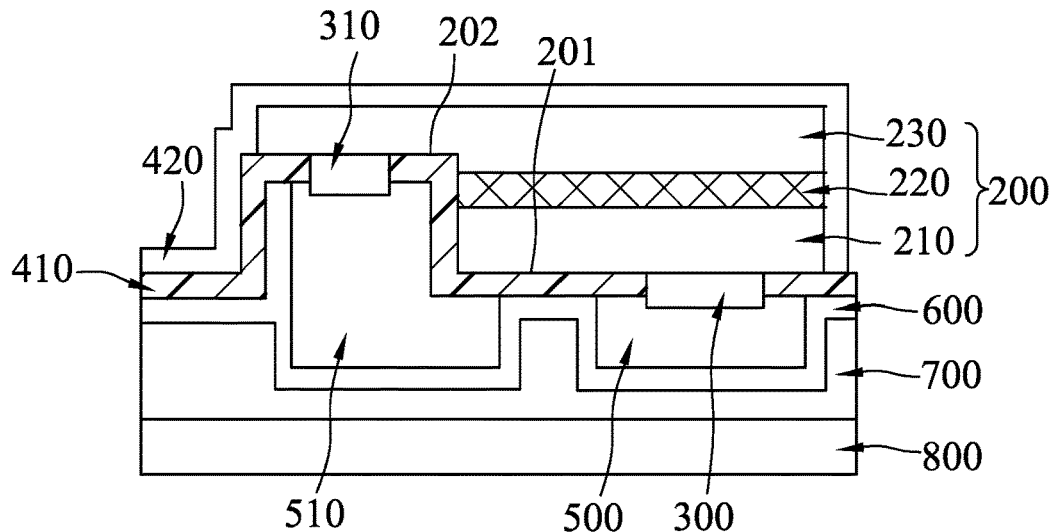
Figure 5A:
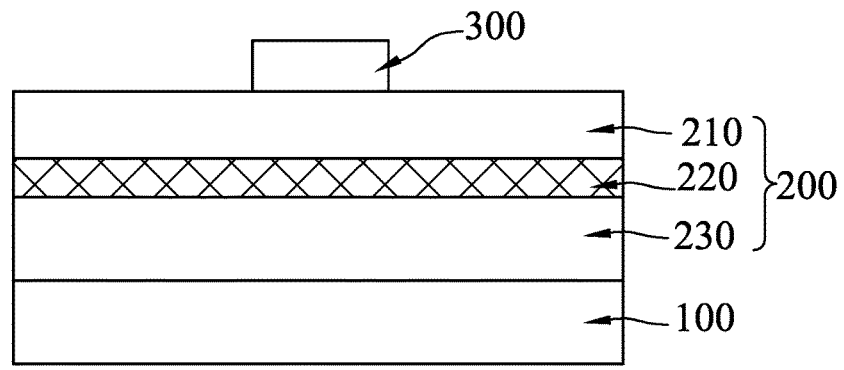
FIG. 5a is schematic cross-sectional view taken along line B-B of FIG. 3a, illustrating an intermediate step in the making process of the embodiment of the micro light-emitting device.
Figure 5B:
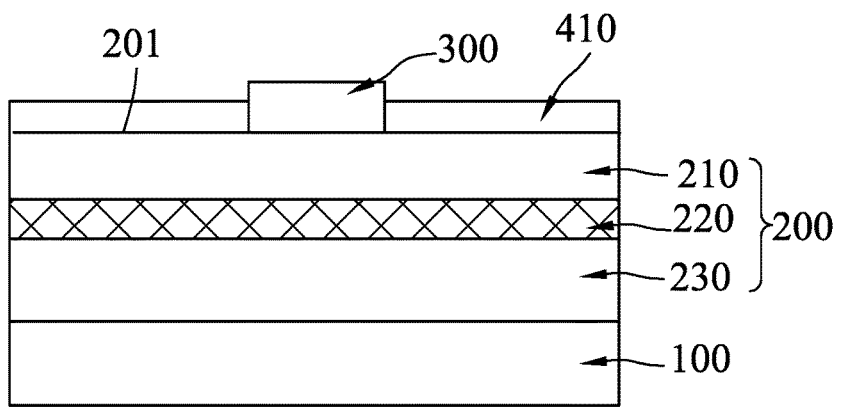
FIGS. 5b to 5f are schematic cross-sectional views illustrating intermediate steps subsequent to FIG. 5a in the making process of the embodiment of the micro light-emitting device.
Figure 5C:
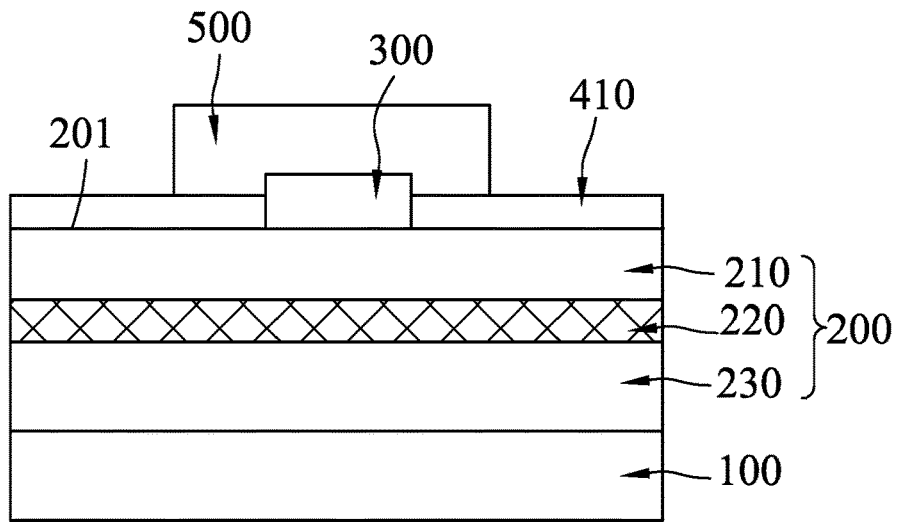
Figure 5D:
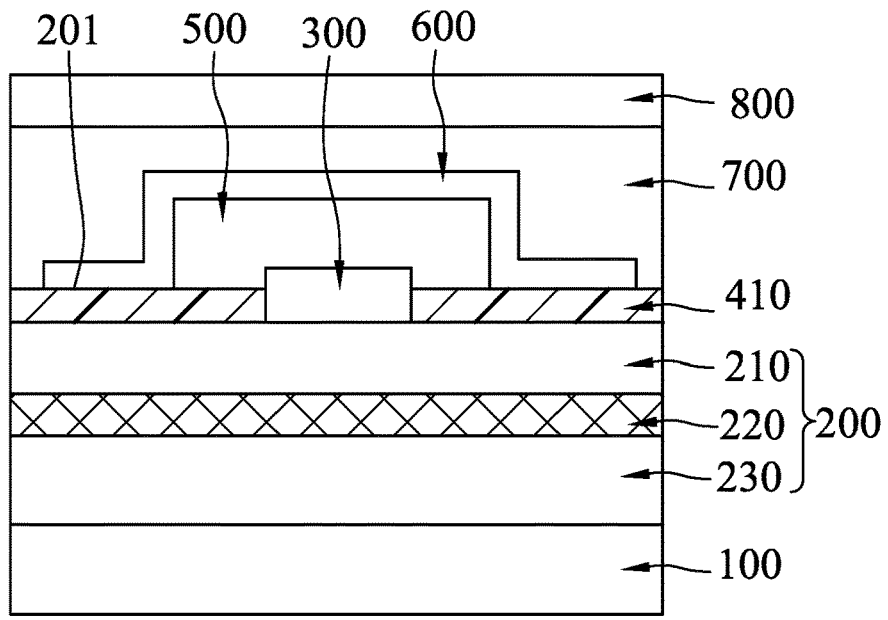
Figure 5E:
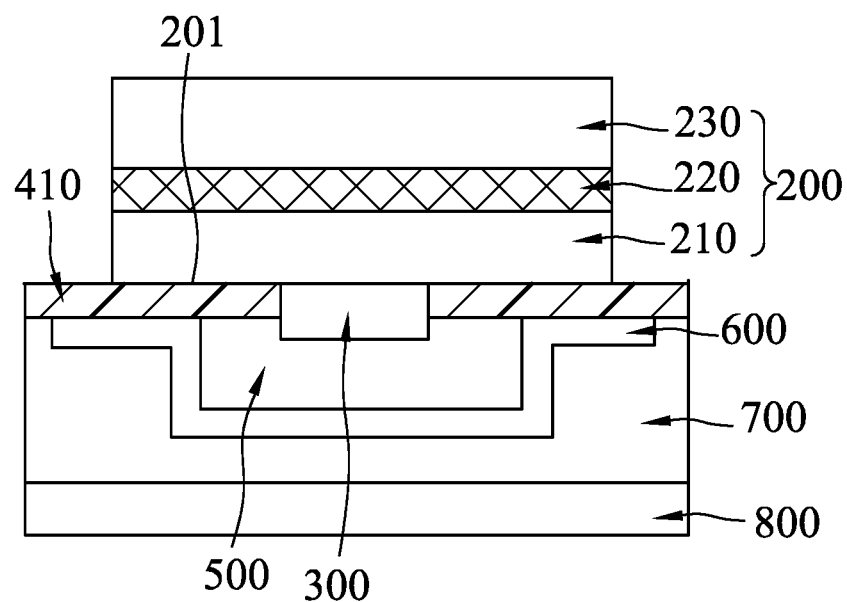
Figure 5F:
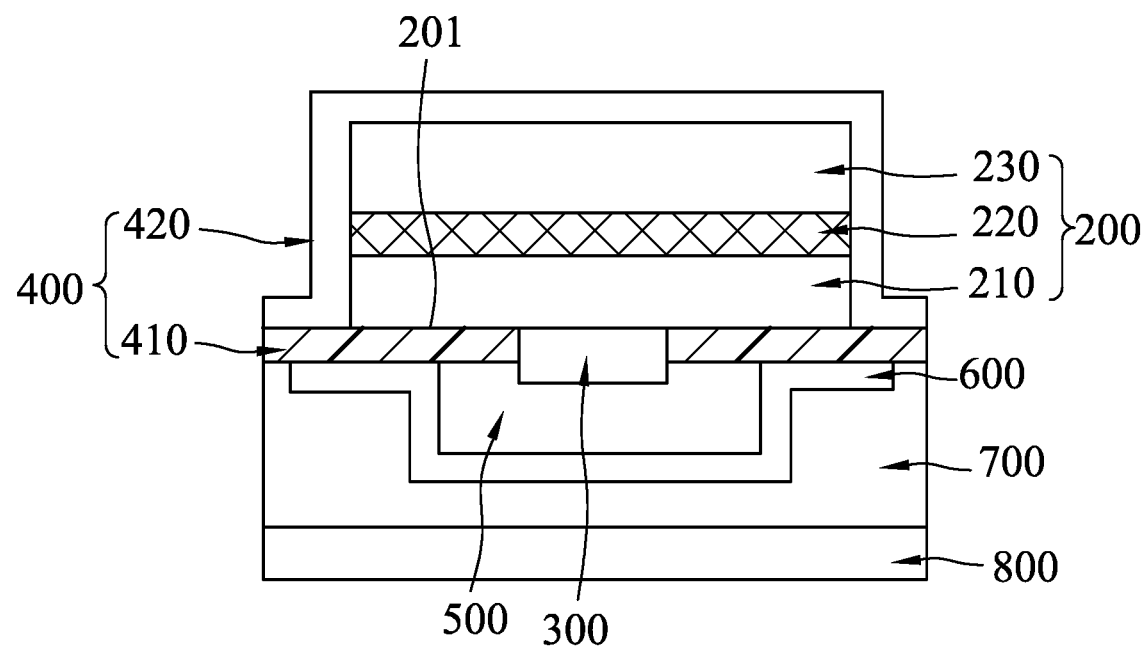

Referring to FIGS. 3d, 4g, and 5f, the micro light-emitting device according to the disclosure includes an epitaxial structure 200 and a bridge connection structure 400. The number of the epitaxial structures 200 may be one or more. When the micro light-emitting device includes a plurality of the epitaxial structures 200, the epitaxial structures 200 are spaced apart from each other.

The epitaxial structure 200 includes a first mesa surface 201 and a second mesa surface 202. The first and second mesa surfaces 201, 202 are located on the same side of the epitaxial structure 200 with a height difference therebetween, have the same widths in a first direction, and respectively have center points in the first direction that are aligned in a second direction perpendicular to the first direction. In this embodiment, the first direction is a direction along lines B-B in FIGS. 3a to 3d, which is a width direction of the light-emitting device.

The bridge connection structure 400 includes a first bridge connection layer 410 that is formed on the first and second mesa surfaces 201, 202 so that the first bridge connection layer 410 is symmetrically disposed on at least one of the first and second mesa surfaces 201, 202 with a line of symmetry thereof being in the second direction and passing through the center points of the first and second mesa surfaces 201, 202. Such configuration can prevent the first bridge connection layer 410 of the bridge connection structure 400 from breaking due to an uneven stress distribution in the micro light-emitting device, thereby improving the stability of the first bridge connection layer 410.

Referring to FIG. 3d, in certain embodiments, each of the widths (D) of the first and second mesa surfaces 201, 202 in the first direction is the same as a width of the epitaxial structure 200 in the first direction.

As shown in FIG. 5f, which is a schematic cross-sectional view of the micro light-emitting device taken along line B-B of FIG. 3d (note that a second bridge connection layer 420 which is not shown in FIG. 3d, is shown here in FIG. 5f), a first portion of the first bridge connection layer 410 that extends over the entire width of the epitaxial structure 200 in the first direction and that corresponds in position to the first mesa surface 201 is a flat structure that has opposite flat surfaces, one of which contacts the epitaxial structure 200. A second portion of the first bridge connection layer 410 that extends over the entire width of the epitaxial structure 200 in the first direction and that corresponds in position to the second mesa surface 202 is a flat structure that has opposite flat surfaces, one of which contacts the epitaxial structure 200. Accordingly, unlike the conventional micro LED shown in FIG. 1, since the second mesa surface 202 does not surround the first mesa surface 201, the first and second portions of the first bridge connection layer 410 do not include any inflection points (corners), thereby improving the stability of the first bridge connection layer 410 of the bridge connection structure 400, and thereby improving the evenness of the stress distribution in the micro light-emitting device in the first direction. Additionally, it should be noted that the first bridge connection layer 410 also has less inflection points in the second direction.

In certain embodiments, the first bridge connection layer 410 protrudes relative to the epitaxial structure 200 in the first direction. That is, the first bridge connection layer 410 has a protruding portion that extends outwardly of the epitaxial structure 200. The protruding portion has a protrusion length measured from an edge of the epitaxial structure 200 that may range from 1.5 μm to 5 μm, e.g., from 2 μm to 3 μm.

Referring to FIGS. 4g and 5f, the epitaxial structure 200 may include a first semiconductor layer 210, an active layer 220, and a second semiconductor layer 230 that are sequentially disposed on one another in such order from bottom to top. The first semiconductor layer 210 may be an N-type semiconductor layer, the active layer 220 may be a multi-layer quantum well structure, and the second semiconductor layer 230 may be a P-type semiconductor layer. In addition to having the option to include the N-type semiconductor layer, the multilayer quantum well structure, and the P-type semiconductor layer, the epitaxial structure 200 may further include other components for enhancing the performance of the micro light-emitting device. In this embodiment, the micro light-emitting device is configured to emit light with a wavelength ranging from 400 nm to 950 nm, such as red light. The material for forming the epitaxial structure 200 includes, but is not limited to, aluminum gallium arsenide (AlGaAs), gallium arsenide phosphide (GaAsP), aluminum gallium indium phosphide (AlGaInP), and gallium phosphide (GaP).

In certain embodiments, the first semiconductor layer 210 has a lower surface that forms the first mesa surface 201; and the second semiconductor layer 230 has an exposed surface that forms the second mesa surface 202, and a back surface opposite to the exposed surface and away from the active layer 220. Each of the first and second mesa surfaces 201, 202 has a height relative to the back surface, and the height of the first mesa surface 201 is larger than that of the second mesa surface 202.

In certain embodiments, the epitaxial structure 200 has a light exiting surface opposite to the first and second mesa surfaces 201, 202. The light exiting surface may be a roughened surface for improving light-extraction efficiency of the micro light-emitting device. In certain embodiments, the light exiting surface of the epitaxial structure 200 is the back surface of the second semiconductor layer 230.

In some embodiments, the epitaxial structure 200 has first and second lateral surfaces opposite to each other in the first direction, and third and fourth lateral surfaces opposite to each other in the second direction; and the first and second mesa surfaces 201, 202 are located oppositely in the second direction at the epitaxial structure 200, such that the first mesa surface 201 meets the first, second, and third lateral surfaces, and the second mesa surface 202 meets the first, second, and fourth lateral surfaces. In addition, the first mesa surface 201 may have an edge that is opposite to the second mesa surface 202 and that is at the third lateral surface of the epitaxial structure 200, and the second mesa surface 202 may have an edge that is opposite to the first mesa surface 201 and that is at the fourth lateral surface of the epitaxial structure 200.

The first bridge connection layer 410 may include a single-layered insulating layer or a distributed Bragg reflector (DBR) layer. The single-layered insulating layer may be made of silicon oxide, silicon nitride, titanium oxide, aluminum oxide, or magnesium fluoride. The DBR layer may be formed by alternately stacking at least two materials, such as silicon oxide ($SiO_2$), titanium oxide ($TiO_2$), zinc oxide ($ZnO_2$), zirconium oxide ($ZrO_2$), and copper oxide ($Cu_2O_3$), using a technique such as electron beam vapor deposition or ion beam sputtering.

Referring to FIGS. 3d, 4g, and 5f, the micro light-emitting device may further include a first electrode 300 and a second electrode 310. The first electrode 300 is formed on the first mesa surface 201 and is electrically connected to the first semiconductor layer 210. The second electrode 310 is formed on the second mesa surface 202 and is electrically connected to the second semiconductor layer 230.

In certain embodiments, the first electrode 300 is formed on the first mesa surface 201 so that the first electrode 300 is symmetric with a line of symmetry thereof being in the second direction and passing through the center points of the first and second mesa surfaces 201, 202; and the second electrode 310 is formed on the second mesa surface 202 so that the second electrode 310 is symmetric with a line of symmetry thereof being in the second direction and passing through the center points of the first and second mesa surfaces 201, 202.

The first and second electrodes 300, 310 may be exposed from the first bridge connection layer 410. The first bridge connection layer 410 may be symmetrical with respect to at least one of the first and second electrodes 300, 310 when viewed in the second direction.

Referring to FIGS. 3d, 4g, and 5f, the micro light-emitting device may further include a first pad 500 and a second pad 510. The first pad 500 is formed on the first bridge connection layer 410 opposite to the epitaxial structure 200, and is electrically connected to the first electrode 300. The second pad 510 is formed on the first bridge connection layer 410 opposite to the epitaxial structure 200, and is electrically connected to the second electrode 310.

In some embodiments, the first and second pads 500, 510 have surfaces that are opposite to the epitaxial structure 200 and that are flush with each other.

Referring to FIGS. 4g and 5f, the micro light-emitting device may further include a sacrificial layer 600, a bonding layer 700, and a substrate 800.

The sacrificial layer 600 is formed, e.g. conformally formed, on the first bridge connection layer 410 opposite to the epitaxial structure 200, and covers a lower surface of the first bridge connection layer 410 that is opposite to the epitaxial structure 200, lower surfaces of the first and second pads 500, 510 that are opposite to the epitaxial structure 200, and lateral surfaces of the first and second pads 500, 510. The sacrificial layer 600 has an opening (not shown) formed at a part of the sacrificial layer 600 that is not registered with the epitaxial structure 200. The opening exposes the first bridge connection layer 410. The sacrificial layer 600 may be a titanium-tungsten (TiW) film layer or other film layer that can be easily removed by wet etching techniques. A portion of the sacrificial layer 600 that is formed on a portion of the first bridge connection layer 410 that extends over the entire width of the epitaxial layer 200 in the first direction and that corresponds in position to the first mesa surface 201 is a flat structure. That is, a first interface between the sacrificial layer 600 and the first bridge connection layer 410 that extends along the first direction and that corresponds in position to the first mesa surface 201 is flat, and thus, the first interface between the sacrificial layer 600 and the first bridge connection layer 410 has no inflection point (corner). Similarly, a second interface between the sacrificial layer 600 and the first bridge connection layer 410 that extends along the first direction and that corresponds in position to the second mesa surface 202 is flat, and thus, the second interface between the sacrificial layer 600 and the first bridge connection layer 410 has no inflection point (corner). Thus, when removing the sacrificial layer 600 by a wet etching process, etching may proceed completely so that the sacrificial layer 600 can be removed entirely.

The bonding layer 700 is formed on the sacrificial layer 600 opposite to the first bridge connection layer 410, and fills the opening of the sacrificial layer 600 to be in contact with the first bridge connection layer 410. The bonding layer 700 may be made of any bonding agent, and may be a benzocyclobutene layer.

The substrate 800 is disposed on the bonding layer 700 opposite to the first bridge connection layer 410. The substrate 800 may be made of sapphire, glass, silicon, or silicon carbide.

Referring to FIGS. 4g and 5f, the bridge connection structure 400 may further include a second bridge connection layer 420. The second bridge connection layer 420 covers a light exiting surface of the epitaxial structure 200 opposite to the first mesa surface 201, and a lateral surface of the epitaxial structure 200.

The second bridge connection layer 420 may include a single-layered insulating layer or a distributed Bragg reflector (DBR) layer. The single-layered insulating layer may be made of silicon oxide, silicon nitride, titanium oxide, aluminum oxide, or magnesium fluoride. The DBR layer may be formed by alternately stacking at least two materials, such as silicon oxide ($SiO_2$), titanium oxide ($TiO_2$), zinc oxide ($ZnO_2$), zirconium oxide ($ZrO_2$), and copper oxide ($Cu_2O_3$), using a technique such as electron beam vapor deposition or ion beam sputtering.

The present disclosure also provides an embodiment of a method for making the aforesaid light-emitting device. The method includes steps S10 to S70.

In step S10, as shown in FIGS. 3a, 4a, and 5a, the epitaxial structure 200 is provided.

In particular, in step S10, the epitaxial structure 200 is formed on the growth substrate 100, which may be a gallium arsenide substrate. The epitaxial structure 200 includes the first semiconductor layer 210, the active layer 220, and the second semiconductor layer 230. In this embodiment, the micro light-emitting device is configured to emit light with a wavelength ranging from 400 nm to 950 nm, such as red light. The material for forming the epitaxial structure 200 includes, but is not limited to, aluminum gallium arsenide (AlGaAs), gallium arsenide phosphide (GaAsP), aluminum gallium indium phosphide (AlGaInP), and gallium phosphide (GaP). The epitaxial structure 200 has a width direction that is the same as the first direction, a length direction that is the same as the second direction, and a thickness direction perpendicular to both the first and second directions.

In step S20, as shown in FIGS. 3a, 4a and 5a, the first electrode 300 is formed on a first side of the epitaxial structure 200 opposite to the growth substrate 100.

To be specific, the first electrode 300 is formed on a surface of the first semiconductor layer 210 that will be formed into the first mesa surface 201 in a subsequent step, and is electrically connected to the first semiconductor layer 210.

In step S30, as shown in FIGS. 3b, 4b, and 5a, the epitaxial structure 200 is etched from the first side thereof so that a groove that is recessed in the thickness direction into the epitaxial structure 200 and that extends through the epitaxial structure 200 in the first direction is formed, and so that the epitaxial structure 200 has the first mesa surface 201 that is a surface of the first side of the epitaxial structure 200 and the second mesa surface 202 that is a surface exposed from the groove. The first and second mesa surfaces 201, 202 face the same direction.

To be specific, the epitaxial structure 200 is etched downwardly from the first side of the epitaxial structure 200 in the thickness direction so as to form the groove. As shown in FIG. 3b, the groove has a length (a) in the second direction and a width (b) in the first direction. In certain embodiments, the width (b) of the groove is the same as a width of the epitaxial structure 200 in the first direction. In this embodiment, the groove exposes a part of the second semiconductor layer 230, so that the exposed surface of the second semiconductor layer 230 is the second mesa surfaces 202.

In step S40, as shown in FIGS. 3b, 4b, and 5a, the second electrode 310 is formed on the second mesa surface 202 to be electrically connected to the second semiconductor layer 230.

In step S50, as shown in FIGS. 4c and 5b, the first bridge connection layer 410 is formed on the first and second mesa surfaces 201, 202. The first bridge connection layer 410 may have a first portion that extends over the entire width of the epitaxial structure 200 in the first direction and that corresponds in position to the first mesa surface 201, and a second portion that extends over the entire width of the epitaxial structure 200 in the first direction and that corresponds in position to the second mesa surface 202. The first portion of the first bridge connection layer 410 is a flat structure that has opposite flat surfaces, one of which contacts the epitaxial structure 200. The second portion of the first bridge connection layer 410 is a flat structure that has opposite flat surfaces, one of which contacts the epitaxial structure 200.

In particular, the first bridge connection layer 410 is formed across the surface of the first side of the epitaxial structure 200 and the exposed surface which is exposed from the groove. The first and second electrodes 300, 310 are exposed from the first bridge connection layer 410.

In step S60, as shown in FIGS. 3c, 4d, and 5c, the first and second pads 500, 510 are formed on the first bridge connection layer 410 opposite to the epitaxial structure 200. The first pad 500 is electrically connected to the first electrode 300, and the second pad 510 is electrically connected to the second electrode 310. The first and second pads 500, 510 may each have a surfaces that is opposite to the epitaxial structure 200 and that are flush with each other.

Subsequently, as shown in FIGS. 4e and 5d, the sacrificial layer 600 is formed on the first bridge connection layer 410, the first pad 500, and the second pad 510 by vapor deposition, and is bonded to the substrate 800 by the bonding layer 700. The sacrificial layer 600 may be a titanium-tungsten (TiW) film layer or other film layer that can be easily removed by wet etching techniques. The bonding layer 700 may be made of any bonding agent, and may be a benzocyclobutene layer. The substrate 800 may be made of sapphire, glass, silicon, or silicon carbide.

In some embodiments of the method, the sacrificial layer 600 is formed to have an opening (not shown) that exposes the first bridge connection layer 410. The bonding layer 700 fills the opening of the sacrificial layer 600 to be in contact with the first bridge connection layer 410.

In some embodiments of the method, a first interface between the sacrificial layer 600 and the first bridge connection layer 410 that extends along the first direction and that corresponds in position to the first mesa surface 201 is flat, and thus, the first interface between the sacrificial layer 600 and the first bridge connection layer 410 has no inflection point (corner). Similarly, a second interface between the sacrificial layer 600 and the first bridge connection layer 410 that extends along the first direction and that corresponds in position to the second mesa surface 202 is flat, and thus, the second interface between the sacrificial layer 600 and the first bridge connection layer 410 has no inflection point (corner). Thus, when removing the sacrificial layer 600 by a wet etching process, etching may proceed completely so that the sacrificial layer 600 can be removed entirely.

In step S70, as shown in FIGS. 3d, 4f, and 5e, the epitaxial structure 200 is etched from a second side thereof that is opposite to the first side thereof, such that the first and second mesa surfaces 201, 202 have the same widths in the first direction and respectively have center points in the first direction that are aligned in the second direction.

In particular, in step S70, after removing the growth substrate 100 from the epitaxial structure 200, the epitaxial structure 200 is subjected to a roughening process and is etched from the second side thereof that is opposite to the first side thereof (i.e., opposite to the first bridge connection layer 410).

As shown in FIG. 3d, each of the first and second mesa surfaces 201, 202 may have a width (D) in the first direction, which is the same as a width of the epitaxial structure 200 in the first direction.

In some embodiments of the method, the epitaxial structure 200 has first and second lateral surfaces opposite to each other in the first direction, and third and fourth lateral surfaces opposite to each other in the second direction; and the first and second mesa surfaces 201, 202 are oppositely located in the second direction at the epitaxial structure 200, such that the first mesa surface 201 meets the first, second, and third lateral surfaces, and the second mesa surface 202 meets the first, second, and fourth lateral surfaces. In addition, the first mesa surface 201 may have an edge that is opposite to the second mesa surface 202 and that is at the third lateral surface of the epitaxial structure 200, and the second mesa surface 202 may have an edge that is opposite to the first mesa surface 201 and that is at the fourth lateral surface of the epitaxial structure 200.

In step S70, the first bridge connection layer 410 may protrude relative to the epitaxial structure 200 in the first direction. That is, the first bridge connection layer 410 has a protruding portion that extends outwardly of the epitaxial structure 200. The protruding portion has a protrusion length measured from an edge of the epitaxial structure 200 that may range from 1.5 μm to 5 μm, e.g., from 2 μm to 3 μm.

Preferably, in step S70, the epitaxial structure 200 is etched such that the first bridge connection layer 410 is symmetrically disposed on at least one of the first and second mesa surfaces 201, 202 with a line of symmetry thereof being in the second direction and passing through the center points of the first and second mesa surfaces 201, 202.

In some embodiments of the method, in step S20, the first electrode 300 is formed on the first mesa surface 201 so that the first electrode 300 is symmetric with a line of symmetry thereof being in the second direction and passing through the center points of the first and second mesa surfaces 201, 202; and in step S40, the second electrode 310 is formed on the second mesa surface 202 so that the second electrode 310 is symmetric with a line of symmetry thereof being in the second direction and passing through the center points of the first and second mesa surfaces 201, 202.

The method according to the disclosure may further include, after step S70, a step of forming a second bridge connection layer 420. The second bridge connection layer 420 is formed to cover a surface of the epitaxial structure 200 opposite to the substrate 800 (i.e., opposite to the first and second mesa surfaces 201, 202), and a lateral surface of the epitaxial structure 200. The first and second bridge connection layers 410, 420 form the bridge connection structure 400.

The present disclosure also provides a light-emitting apparatus that includes the aforesaid micro light-emitting device. The light-emitting apparatus may be a television, a mobile phone, or an RGB display.

In sum, by having the abovementioned structures, the micro light-emitting device of this disclosure is able to achieve improvement in the stress distribution therein in the first direction (i.e., the width direction of the micro light-emitting device), such that the bridge connection structure 400 can be prevented from breaking due to an uneven stress distribution in the micro light-emitting device, thereby improving the stability of the bridge connection structure, and thereby further improving the reliability of the micro light-emitting device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A micro light-emitting device, comprising:
    an epitaxial structure including a first mesa surface and a second mesa surface, said first and second mesa surfaces being located on the same side of said epitaxial structure with a height difference therebetween, having the same widths in a first direction, and respectively having center points in the first direction that are aligned in a second direction perpendicular to the first direction; and
    a bridge connection structure including a first bridge connection layer that is formed on said first and second mesa surfaces so that said first bridge connection layer is symmetrically disposed on at least one of said first and second mesa surfaces with a line of symmetry thereof being in the second direction and passing through said center points of said first and second mesa surfaces.

2. The micro light-emitting device of claim 1, wherein each of the widths of said first and second mesa surfaces in the first direction is same as a width of said epitaxial structure in the first direction.

3. The micro light-emitting device of claim 1, wherein said first bridge connection layer protrudes relative to said epitaxial structure in the first direction.

4. The micro light-emitting device of claim 1, wherein a portion of said first bridge connection layer that extends over an entire width of the epitaxial structure in the first direction and that corresponds in position to the first mesa surface is a flat structure.

5. The micro light-emitting device of claim 1, wherein said epitaxial structure includes a first semiconductor layer, an active layer, and a second semiconductor layer that are sequentially disposed on one another in such order, said first semiconductor layer having a surface that forms said first mesa surface, said second semiconductor layer having an exposed surface that forms said second mesa surface and a back surface opposite to said exposed surface and away from said active layer, each of said first mesa surface and said second mesa surface having a height relative to said back surface, the height of said first mesa surface being larger than that of said second mesa surface.

6. The micro light-emitting device of claim 1, further comprising:
    a first electrode that is formed on said first mesa surface so that said first electrode is symmetric with a line of symmetry thereof being in the second direction; and
    a second electrode that is formed on said second mesa surface so that said second electrode is symmetric with a line of symmetry thereof being in the second direction.

7. The micro light-emitting device of claim 1, wherein said first bridge connection layer is symmetrical with respect to at least one of said first and second electrodes when viewed in the second direction.

8. The micro light-emitting device of claim 6, further comprising:
    a first pad that is formed on said first bridge connection layer opposite to said epitaxial structure and that is electrically connected to said first electrode, and
    a second pad that is formed on said first bridge connection layer opposite to said epitaxial structure and that is electrically connected to said second electrode.

9. The micro light-emitting device of claim 8, further comprising:
    a sacrificial layer that is formed on said first bridge connection layer opposite to said epitaxial structure and that covers a lower surface of said first bridge connection layer opposite to said epitaxial structure, lower surfaces of said first and second pads opposite to said epitaxial structure, and lateral surfaces of said first and second pads, said sacrificial layer having an opening formed at a part of said sacrificial layer that is not registered with said epitaxial structure, said opening exposing said first bridge connection layer;
    a bonding layer that is formed on said sacrificial layer opposite to said first bridge connection layer, and that fills said opening of said sacrificial layer to be in contact with said first bridge connection layer; and
    a substrate that is disposed on said bonding layer opposite to said first bridge connection layer.

10. The micro light-emitting device of claim 9, wherein a portion of said sacrificial layer that is formed on a portion of said first bridge connection layer that extends over an entire width of said epitaxial structure in the first direction and that corresponds in position to said first mesa surface is a flat structure.

11. The micro light-emitting device of claim 1, wherein said bridge connection structure further includes a second bridge connection layer that covers a light exiting surface of said epitaxial structure opposite to said first mesa surface, and a lateral surface of said epitaxial structure.

12. The micro light-emitting device of claim 1, wherein said micro light-emitting device includes a plurality of said epitaxial structures that are spaced apart from each other.

13. The micro light-emitting device of claim 1, wherein said micro light-emitting device is configured to emit light with a wavelength ranging from 400 nm to 950 nm.

14. The micro light-emitting device of claim 1, wherein said epitaxial structure has first and second lateral surfaces opposite to each other in the first direction, and third and fourth lateral surfaces opposite to each other in the second direction, said first and second mesa surfaces are located oppositely in the second direction at said epitaxial structure, such that said first mesa surface meets said first, second, and third lateral surfaces, and said second mesa surface meets said first, second, and fourth lateral surfaces.

15. A light-emitting apparatus, comprising a micro light-emitting device as claimed in claim 1.

* * * * *